US011018146B2

(12) United States Patent
Seidel et al.

(10) Patent No.: US 11,018,146 B2
(45) Date of Patent: May 25, 2021

(54) INTEGRATED ELECTRONIC CIRCUIT COMPRISING A FIRST TRANSISTOR AND A FERROELECTRIC CAPACITOR

(71) Applicant: FRAUNHOFER-GESELLSCHAFT ZUR FOERDERUNG DER ANGEWANDTEN FORSCHUNG E.V., Munich (DE)

(72) Inventors: Konrad Seidel, Dresden (DE); Thomas Kaempfe, Dresden (DE); Patrick Polakowski, Dresden (DE)

(73) Assignee: FRAUNHOFER-GESELLSCHAFT ZUR FOERDERTJNG DER ANGEWANDTEN FORSCHUNG E.V., Munich (DE)

( * ) Notice: Subject to any disclaimer, the term of this patent is extended or adjusted under 35 U.S.C. 154(b) by 13 days.

(21) Appl. No.: 16/530,027

(22) Filed: Aug. 2, 2019

(65) Prior Publication Data
US 2020/0043938 A1 Feb. 6, 2020

(30) Foreign Application Priority Data
Aug. 3, 2018 (DE) ...................... 10 2018 213 062.0

(51) Int. Cl.
H01L 27/11507 (2017.01)
H01L 27/06 (2006.01)
(52) U.S. Cl.
CPC .... H01L 27/11507 (2013.01); H01L 27/0629 (2013.01)

(58) Field of Classification Search
CPC ............... H01L 29/92; H01L 29/66083; H01L 21/0228; H01L 28/40
See application file for complete search history.

(56) References Cited

U.S. PATENT DOCUMENTS

| 5,716,875 A | 2/1998 | Jones, Jr. et al. |
| 7,983,067 B2* | 7/2011 | Kitazaki ........... H01L 27/11507 365/145 |
| 2018/0269057 A1* | 9/2018 | Lei ........................ C09D 1/00 |

FOREIGN PATENT DOCUMENTS

| DE | 69833674 | 10/2006 |
| DE | 102017200678 | 7/2017 |
| DE | 102017110434 | 5/2018 |

* cited by examiner

Primary Examiner — Karen Kusumakar
(74) Attorney, Agent, or Firm — Jacobson Holman PLLC

(57) ABSTRACT

The present invention relates to an integrated electronic circuit comprising a first transistor (1) and a ferroelectric capacitor (2). The ferroelectric capacitor (2) comprises a first electrode layer composed of a non-ferroelectric material, a ferroelectric interlayer having a thickness that is less than the thickness of the first electrode layer, and a second electrode layer composed of a non-ferroelectric material, wherein the ferroelectric interlayer is arranged between the first electrode layer and the second electrode layer, and the first electrode layer is electrically conductively connected to a gate terminal of the first transistor (1).

9 Claims, 3 Drawing Sheets

INTEGRATED ELECTRONIC CIRCUIT COMPRISING A FIRST TRANSISTOR AND A FERROELECTRIC CAPACITOR

The present invention relates to an integrated electronic circuit comprising a first transistor and a ferroelectric capacitor.

Non-volatile transistors adjustable in analogue fashion as memristors have not existed heretofore. Analogue-switchable resistors or RRAM module (two-terminals) known from the prior art can be used as analogue-switchable devices, but have very small adjustment ranges and a great dependence on a prior treatment. Moreover, a high thermal sensitivity and complications during integration into existing fabrication processes are evident in the case of two-terminal memristors of this type.

Therefore, the present invention is based on the object of proposing an integrated electronic circuit with which the problems mentioned can be overcome, that is to say which is both analogue-switchable and non-volatile and has a high reliability.

This object is achieved according to the invention by an integrated electronic circuit according to the independent claims and advantageous configurations and developments are described in the dependent claims.

An integrated electronic circuit comprises a first transistor and a ferroelectric capacitor. The ferroelectric capacitor comprises a first electrode layer composed of a non-ferroelectric material, a ferroelectric interlayer, and a second electrode layer composed of a non-ferroelectric material. The ferroelectric interlayer is arranged between the first electrode layer and the second electrode layer. The first electrode layer is electrically conductively connected to a gate terminal of the first transistor.

The presented construction both of the entire integrated electronic circuit and of the ferroelectric capacitor can be integrated well in the CMOS process flow (complementary metal-oxide-semiconductor). As a result of the electrically conductive connection between the ferroelectric capacitor and the integrated transistor, a channel current of the transistor is influenced depending on the polarization state of the ferroelectric capacitor. In this case, the materials used for the ferroelectric capacitor are typically lead-free and RHoS-compliant (that is to say comply with EU Directive 2011/65/EU). Preferably, the thickness of the ferroelectric interlayer is smaller or less than the thickness of the first electrode layer. Use of a thin-film ferroelectric as interlayer does not just result in CMOS compatibility; the low fabrication costs also allow a higher throughput and, owing to the small thickness of the voltage-variable ferroelectric capacitor, a high scalability for very greatly miniaturized systems.

The thickness of the ferroelectric interlayer is preferably less than 100 nm, particularly preferably less than 40 nm. With these thicknesses, a change in the polarization state of the ferroelectric is achieved even at low electrical voltages of less than 5 V and preferably less than 3 V. Thus, a required control voltage is significantly lower than in known low-voltage solutions and use for low-power applications is possible.

The ferroelectric interlayer can be embodied from or at least comprise hafnium oxide ($HfO_2$) doped with silicon, aluminium, germanium, magnesium, calcium, strontium, barium, titanium, zirconium, one or a plurality of rare earth elements, that is to say scandium, lanthanum, cerium, praseodymium, neodymium, promethium, samarium, europium, yttrium, gadolinium, terbium, dysprosium, holmium, erbium, thulium, ytterbium, lutetium, as dopant, or undoped hafnium oxide, and zirconium oxide doped with silicon, aluminium, germanium, magnesium, calcium, strontium, barium, titanium, one or a plurality of rare earth elements, that is to say scandium, lanthanum, cerium, praseodymium, neodymium, promethium, samarium, europium, yttrium, gadolinium, terbium, dysprosium, holmium, erbium, thulium, ytterbium, lutetium, as dopant, or undoped zirconium oxide ($ZrO_2$). The elements and materials mentioned are suitable for a conformal embodiment of layers.

In order to increase a breakdown strength, provision can be made for the ferroelectric interlayer to be embodied in multi-layered fashion and to comprise at least one layer composed of an oxide layer having a thickness of less than 3 nm and a hafnium oxide layer or zirconium oxide layer having a thickness of between 3 nm and 20 nm. This configuration, also referred to as "ultralaminate", increases not only the breakdown voltage but also the switching voltage, for example by a factor of 5. For high-voltage applications, alternating series driving of the ferroelectric capacitors can additionally be effected. On account of the CMOS compatibility of hafnium oxide ($HfO_2$) and of zirconium oxide ($ZrO_2$) and of the dopants mentioned, it is thus possible to fabricate further electronics on the same substrate, that is to say fabrication on-chip. The device described can be produced as an individual miniaturized SMD device (surface mounted device), such that even extremely small designs such as the 01005 format can be implemented. The oxide layer can be embodied as an aluminium oxide layer ($Al_2O_3$), a silicon oxide layer ($SiO_2$) and/or a zirconium oxide layer ($ZrO_2$).

In a method for producing an integrated electronic circuit, a first electrode layer composed of a non-ferroelectric material is applied on a surface of a semiconductor substrate. A ferroelectric interlayer is applied on the first electrode layer, and a second electrode layer is applied on the ferroelectric interlayer, such that the first electrode layer, the ferroelectric interlayer and the second electrode layer form a ferroelectric capacitor. The first electrode layer is electrically conductively connected to a gate terminal of a first transistor of the integrated electronic circuit.

For direct punch-through control to a gate of a metal-insulator-semiconductor structure (MIS structure) without a storage function, a bypass transistor can be conductively connected to the first electrode layer and the second electrode layer.

Provision can also be made for a second transistor to be electrically conductively connected by its drain terminal to the electrical connection between the ferroelectric capacitor and the gate terminal of the first transistor, in order to achieve independent switching of the ferroelectric capacitor or a decoupling of the switching path.

The semiconductor substrate can be structured, for example by a structure embodied in recessed fashion relative to the surface of the semiconductor substrate being introduced into the semiconductor substrate, on which structure the first electrode layer, the ferroelectric interlayer and the second electrode layer are deposited. In this case, the layers mentioned are typically applied not only on the surface of the structure, but also on that surface of the semiconductor substrate which is not structured in this way. Introducing the structure into the semiconductor substrate, that is to say structuring the semiconductor substrate, results in an effective area enlargement that brings about a significant increase in the capacitance. In the case of area enlargement up to a factor of 28, for example, in the case of a conformal deposition of the ferroelectric interlayer, which is typically applied as a ferroelectric thin film by means of suitable thin film methods, voltage-variable capacitor devices having a very high capacitance are produced, which enables changes in capacitance in the event of a change in an AC voltage. Area enlargements by as much as a factor of 100 should thus be possible, which enables specific capacitances of an order of magnitude of approximately 1000 µF/cm$^2$, taking account of the planar area. Precisely in the case of a low control voltage, the capacitance thus achievable significantly exceeds the capacitances of voltage-variable capacitors available hitherto and makes possible a higher degree of miniaturization and an increase in the integration density of voltage-variable capacitors. In this case, the ferroelectric interlayer is typically deposited both parallel to the surface of the semiconductor substrate and in the structure embodied in recessed fashion, or the depression, such that a three-dimensional structuring of the semiconductor substrate, that is to say a structuring along three spatial axes, also brings about an effective area enlargement of the ferroelectric layer. In this case, the conductivity of the semiconductor substrate can be increased for example by means of a doping or siliciding.

The three-dimensional structuring of the semiconductor substrate can be realized as an in-via structure, i.e. using different metallization planes. This enables an area enlargement by a factor of 2 to 3. For highly scaled technology nodes, moreover, this layer can be introduced into a plurality of metallization planes and be interconnected in series and/or in parallel with one another.

Typically, the topmost layer, that is to say the second electrode layer, forms a planar termination, wherein the structure embodied in recessed fashion in the semiconductor substrate is no longer discernible on the basis of the surface constitution and the entire arrangement can thus be processed further and electrically contacted more simply. Preferably, at least one, but typically each, of the applied layers, that is to say the first electrode layer, the ferroelectric interlayer and/or the second electrode layer, is embodied as a conformal layer which covers the underlying layer, with which it is in immediate, that is to say direct, contact, without a cutout or holes and completely covers the recess both at the bottom and at sidewalls. This may exclude dipping edge regions of the respective layer. In particular, the ferroelectric interlayer preferably covers the entire structure embodied in recessed fashion or recess.

The semiconductor substrate used can be highly doped silicon, which has a sufficiently high electrical conductivity and at the same time can be structured well.

The first electrode layer and/or the second electrode layer are/is typically composed of an electrically conductive material that is able to be deposited well, preferably a metal, in particular titanium nitride (TiN), platinum (Pt) or ruthenium oxide ($RuO_2$ or $RuO_4$). The first electrode layer and the second electrode layer can be embodied from the same material, but provision can also be made for these layers alternatively to be constructed from different materials.

The structure embodied in recessed fashion on the semiconductor substrate typically has a width of between 10 nm and 10 µm, preferably between 200 nm and 5 µm, particularly preferably between 500 nm and 1.5 µm. This structure can have a depth of between 10 nm and 100 µm, preferably between 1 µm and 50 µm, particularly preferably between 1.5 µm and 20 µm.

The structure embodied in recessed fashion can be embodied as a trench, a blind hole, a tower-shaped structure, a pedestal-shaped structure or a rib-shaped structure. Provision can also be made for more than one structure embodied in recessed fashion to be introduced into the substrate.

Preferably, the first electrode layer and the second electrode layer are applied by means of atomic layer deposition (ALD) or chemical vapour deposition (CVD) in order to achieve an efficient coating having the desired technical parameters.

Provision can be made for the ferroelectric layer to be applied by means of atomic layer deposition, in particular by means of atomic layer deposition with alternating deposition cycles of a dielectric material and a dopant.

The structure embodied in recessed fashion is typically embodied by means of reactive ion etching or deep reactive ion etching.

Typically, the topmost layer, that is to say the second electrode layer, forms a planar termination, wherein the structure embodied in recessed fashion in the substrate is no longer discernible on the basis of the surface constitution and the capacitor can thus be processed further more simply. Preferably, at least one, typically each, of the applied layers, that is to say the first electrode layer, the ferroelectric layer and/or the second electrode layer, is embodied as a conformal layer which covers the underlying layer, with which it is in immediate, that is to say direct, contact, without cutouts or holes (if appropriate apart from an edge region) and completely covers the depression both at the bottom and at sidewalls. The ferroelectric layer, in particular, preferably covers the entire recess.

The method described is embodied for producing the integrated electronic circuit described, that is to say that the electronic circuit described can be produced by the method described.

Exemplary embodiments of the invention are illustrated in the drawings and are explained below with reference to FIGS. 1 to 7.

Figure 1:
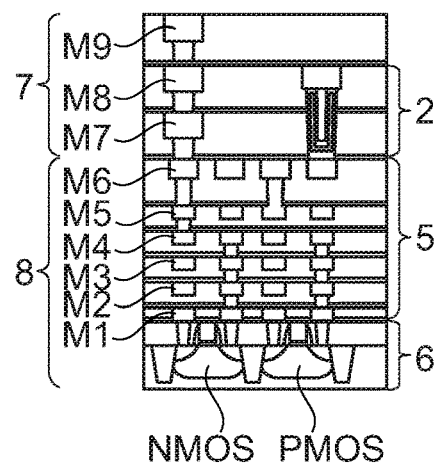
FIG. 1 shows a schematic sectional view of an integrated electronic circuit.

A switch constructed by means of a CMOS process can be seen in a schematic sectional view in FIG. 1. In this case, a ferroelectric capacitor 2 is arranged on the CMOS structures of the FEoL 6 (Front-end of line) and the metallizations of the BEoL 5 (Back-end of line). In this case, a standardized CMOS process flow was followed up to one of the metallization planes 1 to 10, which corresponds to a preprocessed wafer 8 or preprocessed semiconductor substrate, on which an integrated electronic circuit 7 is then applied.

The highly doped silicon wafer is structured by means of RIE etching or DRIE etching (reactive-ion etching or deep reactive-ion etching), such that trench or hole structures can be shaped. However, it is also possible for tower-, pedestal- or rib-shaped structures to be embodied or it is possible to carry out etching into different metallization planes.

Afterwards, a first electrode layer 4 composed of titanium nitride is applied by means of atomic layer deposition. A ferroelectric interlayer having a thickness of less than 40 nm is deposited on the first electrode layer. In this case, the ferroelectric interlayer can be applied as doped or undoped hafnium oxide. Optionally, a layer-by-layer or ply-by-ply deposition of hafnium oxide followed by a further oxide layer is effected, thus resulting in an alternating layer construction, a so-called ultralaminate.

Finally, a second electrode layer composed of titanium nitride is deposited by means of atomic layer deposition and the metal-ferroelectric-metal layer stack embodied is structured in such a way that the bottom electrode, that is to say the second electrode layer, is electrically only in contact with a gate terminal of a field effect transistor. In this case, the first electrode layer and the second electrode layer have a thickness of 3 nm to 500 nm, preferably 10 nm to 30 nm. The thickness of the first electrode layer and the thickness of the second electrode layer can be identical, but the two thicknesses can also deviate from one another.

Provision can be made, moreover, for processing the top electrode, that is to say the second electrode layer, with a word line as in the standard process flow of the BEoL. Alternatively, a contacting with a bypass transistor is also possible in order to obtain a direct control access without a storage function. In a further alternative, provision can be made of a second transistor for independent switching and a decoupling of the switching path.

Figure 2:
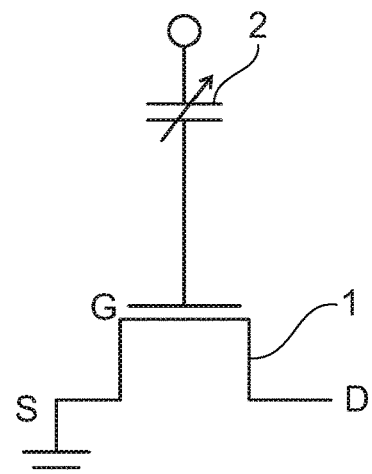
FIG. 2 shows a schematic view of a circuit comprising a ferroelectric capacitor and a transistor.

FIG. 2 schematically illustrates a basic principle of an analogue switch comprising the elements described. Recurring features are provided with identical reference signs in this figure and also in the subsequent figures. The transistor 1, a MOSFET transistor (metal-oxide semiconductor field effect transistor) in the exemplary embodiment illustrated, is connected by its gate terminal to the ferroelectric capacitor 2.

Figure 3:
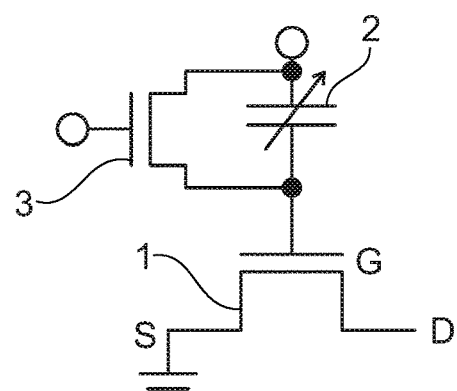
FIG. 3 shows the circuit illustrated in FIG. 2 supplemented by a bypass transistor.

In the variant illustrated in FIG. 3, a bypass transistor 3 is arranged in parallel with the ferroelectric capacitor 2, with the result that the already mentioned direct control access to the MIS gate without a storage function is obtained.

Figure 4:
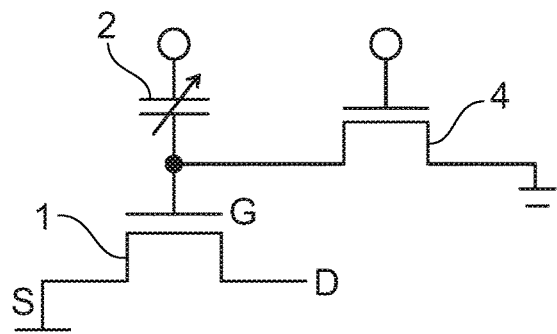
FIG. 4 shows the circuit illustrated in FIG. 2 supplemented by a further transistor.

In the embodiment illustrated in FIG. 4, by contrast, the basic circuit from FIG. 2 is extended by a second transistor 4, which, by way of its drain terminal, electrically conductively contacts the electrical connection between the ferroelectric capacitor 2 and the gate terminal of the first transistor 1 and thus achieves a decoupling of the switching path.

The arrangement of the ferroelectric capacitor 2 and of the first transistor 1 as illustrated in FIG. 1 can be used for driving illuminant arrays. In this case firstly, by means of a standard CMOS process flow, an array of said arrangement is produced and each source contact in a row of the array is electrically conductively connected to a common bit line. This is followed by contacting the drain contact of each individual device with an illuminant, for example an organic light-emitting diode, OLED. This can be done within the CMOS process flow by means of contact pads as far as the last metallization plane. Each of the electrodes of the ferroelectric capacitors 2 of said arrangement in a column is connected to a common word line, that is to say is likewise electrically contacted, wherein the word line is selected via decoder banks. Finally, the illuminant is applied.

A corresponding arrangement can also be utilized outside CMOS technology for OLED screens or TFT (thin-film transistor) displays. Features can be set and altered in a targeted manner by means of the analogue-trimmable ferroelectric interlayer connected to the control terminal or gate terminal of a transistor. This results in a significantly lower driving complexity since only differential image or pixel changes take place and (quasi-)static displays thus become possible.

In a further use, the circuit shown in FIG. 3 can be used for sensor read-out. In this case, a sensor is electrically contacted with the second electrode layer, that is to say the top electrode of the ferroelectric capacitor 2. A sensor voltage is read out by means of drain current; erasure is effected by means of the bypass transistor 3. As a result, the sensor voltage is obtained already in directly amplified fashion at the sensor without an additional load.

Figure 5:
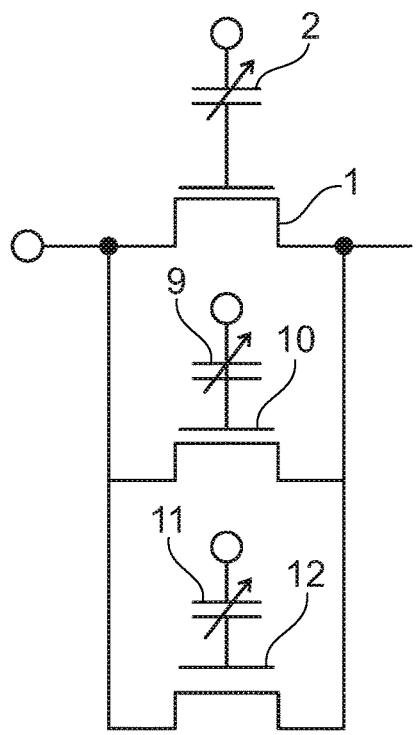
FIG. 5 shows a view corresponding to FIG. 2 of a dimmer circuit.

FIG. 5 shows, in a view corresponding to FIG. 2, a further exemplary embodiment, wherein an array for a dimmer circuit is represented. An element to be dimmed or a luminaire is connected to the last drain contact, that is to say the bottommost drain contact of the transistor 12 in the figure illustrated. The ferroelectric capacitors 2, 9 and 11 form respective pairs with the assigned transistor 1, 10 and 12. By virtue of the linear dimmer illustrated, pulse width modulation is no longer necessary and flicker does not arise.

Figure 6:
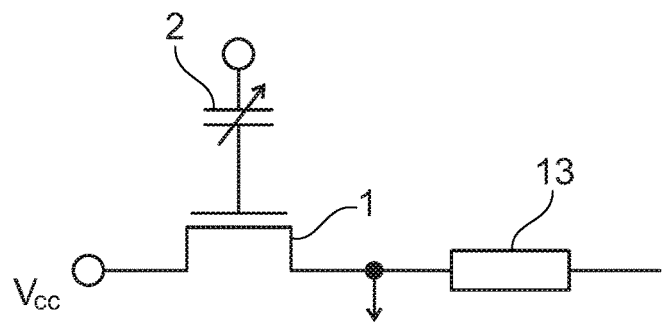
FIG. 6 shows a view corresponding to FIG. 2 of a programmable voltage source.

FIG. 6 shows a programmable current source or voltage source in a view corresponding to FIG. 2. A programmable current tap or voltage tap via an electrical resistor 13 is made possible by the electrical voltage across the ferroelectric capacitor 2. In a similar manner, a trimming capacitor can be realized, wherein the capacitance is modulated by way of the switching voltage.

Figure 7:
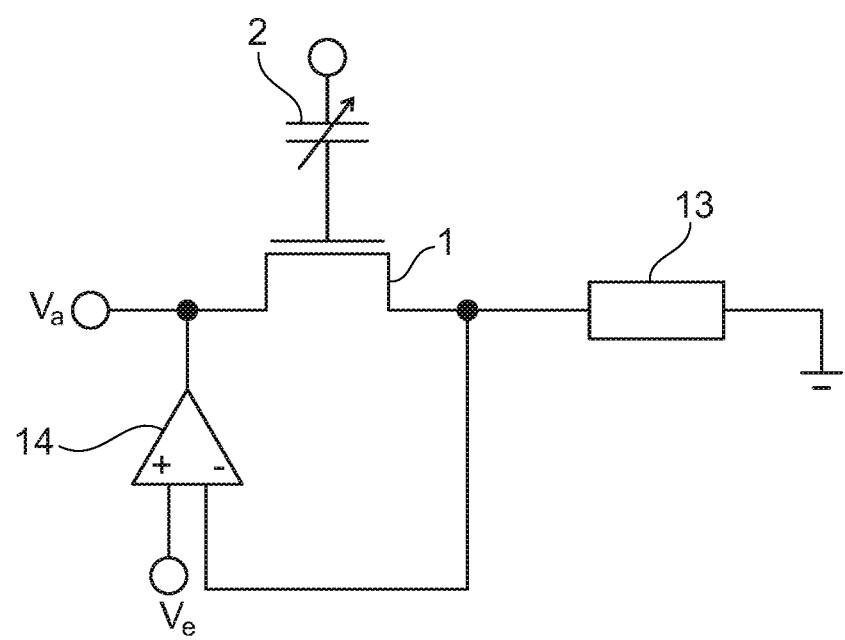
FIG. 7 shows a view corresponding to FIG. 2 of a programmable amplifier.

FIG. 7 illustrates, in a view corresponding to FIG. 2, a programmable amplifier, wherein an operational amplifier 14 and the resistor 13 have been electrically connected to the first transistor 1. The arrangement shown results in an analogue gain that is adjustable in non-volatile fashion.

Features of the various embodiments that are disclosed only in the individual exemplary embodiments can be claimed in combination with one another and individually.

The invention claimed is:

1. Integrated electronic circuit
comprising a first transistor and
a ferroelectric capacitor comprising
a first electrode layer composed of a non-ferroelectric material,
a ferroelectric interlayer, and
a second electrode layer composed of a non-ferroelectric material, wherein the ferroelectric interlayer is arranged between the first electrode layer and the second electrode layer which are electrically contacted with a bypass transistor, and
the first electrode layer is electrically conductively connected to a gate terminal of the first transistor.

2. Integrated electronic circuit according to claim 1, wherein the thickness of the ferroelectric interlayer is less than 100 nm.

3. Integrated electronic circuit according to claim 1, wherein the ferroelectric interlayer is made from hafnium oxide doped with silicon, germanium, magnesium, calcium, strontium, barium, titanium, zirconium, one or a plurality of rare earth elements, or undoped hafnium oxide or from zirconium oxide doped with silicon, aluminium, germanium, magnesium, calcium, strontium, barium, titanium, one or a plurality of rare earth elements, or undoped zirconium oxide.

4. Integrated electronic circuit according to claim 1, wherein the ferroelectric interlayer is made in multi-layered fashion and comprises at least one layer composed of an oxide layer having a thickness of less than 3 nm and a hafnium oxide layer or zirconium oxide layer having a thickness of between 3 nm and 20 nm.

5. Integrated electronic circuit according to claim 4, wherein the oxide layer is made as an aluminium oxide layer, a silicon oxide layer or a zirconium oxide layer.

6. A method for producing an integrated electronic circuit, wherein a first electrode layer composed of a non-ferroelectric material is applied on a surface of a semiconductor substrate,
- a ferroelectric interlayer is applied on the first electrode layer, and
- a second electrode layer is applied on the ferroelectric interlayer, such that the first electrode layer, the ferroelectric interlayer and the second electrode layer form a ferroelectric capacitor, wherein
- the first electrode layer is electrically conductively connected to a gate terminal of a first transistor of the integrated electronic circuit, wherein the first electrode layer and the second electrode layer are electrically contacted with a bypass transistor.

7. Method according to claim 6, wherein a second transistor is electrically conductively connected by its drain terminal to the connection between the ferroelectric capacitor and the gate terminal of the first transistor.

8. The method according to claim 6, wherein at least one structure embodied in recessed fashion relative to the surface of the semiconductor substrate is introduced into the semiconductor substrate, on which at least one structure the first electrode layer, the ferroelectric interlayer and the second electrode layer are deposited.

9. The method according to claim 8, wherein the structure embodied in recessed fashion is embodied as a trench, a blind hole, a pedestal-shaped structure or a rib-shaped structure.

* * * * *